United States Patent [19]

Chapman

[11] Patent Number: 4,471,328
[45] Date of Patent: Sep. 11, 1984

[54] VARIABLE FREQUENCY REFERENCE SOURCE RESPONSIVE TO DIGITAL DATA

[75] Inventor: Ronald H. Chapman, Wheaton, Ill.

[73] Assignee: Motorola, Inc., Schaumburg, Ill.

[21] Appl. No.: 574,193

[22] Filed: Jan. 26, 1984

Related U.S. Application Data

[63] Continuation of Ser. No. 378,037, May 14, 1982, abandoned.

[51] Int. Cl.$^3$ .................. H03K 7/06; H04L 27/12
[52] U.S. Cl. .................. 332/9 R; 332/19; 375/45; 375/62
[58] Field of Search .................. 332/9 R, 19; 375/23, 375/45, 48, 49, 62, 64, 65

[56] References Cited

U.S. PATENT DOCUMENTS 3,414,842 12/1968 Broadhead .................. 332/19
4,206,424 6/1980 Nossen .................. 332/9 R Primary Examiner—Siegfried H. Grimm
Attorney, Agent, or Firm—Charles L. Warren; James W. Gillman; Edward M. Roney

[57] ABSTRACT

A circuit for changing the frequency of a pulse train in response to a change in the average value of an applied digital signal applies the signal to be changed to a pulse subtractor. Application of a predetermined number of digital data signals of one sign causes the periodic subtraction of a pulse at the subtractor, thus reducing the average frequency at the output from the pulse subtractor. The signal at the output from the subtractor is applied to a pulse adder which adds a pulse to the subtracted pulse train in response to a predetermined number of data pulses of the opposite sign. The output pulse train is thus varied in frequency in respose to variation in the average value of the digital data input. The order of addition and subtraction may be reversed, and one of the functions can be performed in the feedback loop of a frequency synthesizer which receives the output pulse train as a reference signal.

10 Claims, 2 Drawing Figures

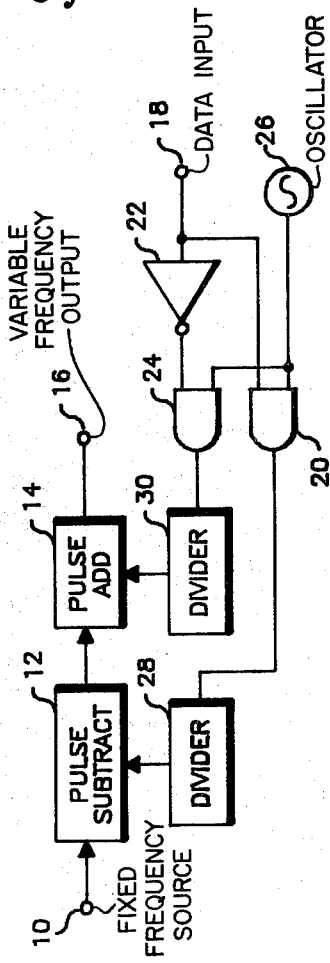
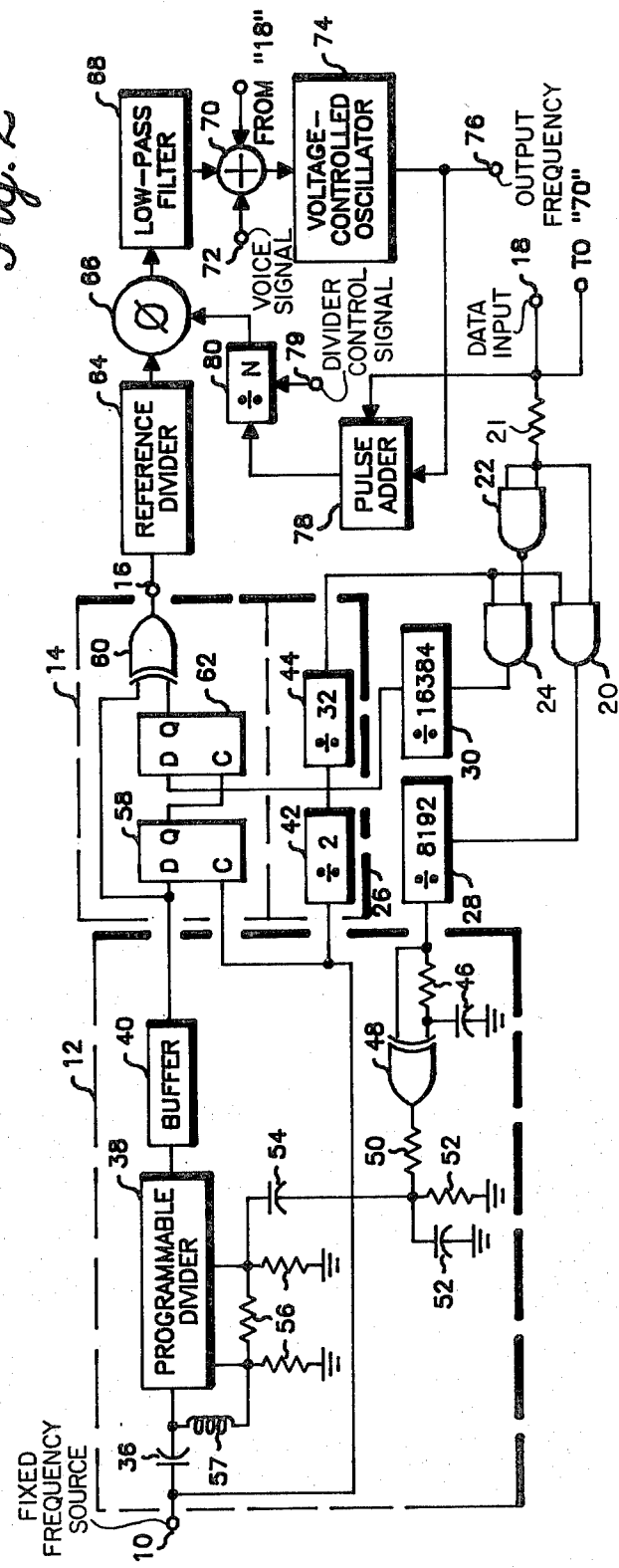

VARIABLE FREQUENCY REFERENCE SOURCE RESPONSIVE TO DIGITAL DATA

This is a continuation of application Ser. No. 378,037, filed May 14, 1982 and now abandoned

BACKGROUND OF THE INVENTION

This invention relates to phase-locked loops.

Radio transceivers gain flexibility at reduced cost by the use of synthesizers as sources of the radio-frequency signals for transmission and for receiving. Such a circuit allows the use of a single frequency-determining element to enable a selection of many channels. This represents a significant saving over the use of multiple crystals, one for each channel that is to be used. When a synthesizer is used in the typical installation for land mobile or fixed station radio communication, using voice signals, a phase-locked loop may be used to generate a frequency that is deviated at an audio rate to produce a modulated signal. When the modulating signal is voice, there is no problem in controlling the deviation of the phase-locked loop and thus the synthesized frequency. When the modulating signal is voice which has a zero average value, the resultant deviation of the synthesizer output frequency around the carrier frequency is a very close representation of the modulating signal.

The situation changes, however, when it is desired to use frequency-shift keying to send digital data in a circuit that uses a synthesizer. There is a significant probability that the data will have a non-zero average value. In other words, the data may have a DC component. The operation of a synthesizer is such that it will not maintain the DC component of a signal, but will cause the average value (the DC component) of the signal to approach asymptotically the at-rest carrier frequency. The long-term effect of this action is to generate unequal frequency deviation of the signal around the carrier value.

SUMMARY OF THE INVENTION

It is an object of the present invention to provide a means for varying the frequency of a pulse train in response to the sign of a data signal.

It is a further object of the present invention to change the average frequency of a train of pulses in conformity with a change in the average value of a digital signal.

Other objects will become apparent in the course of a detailed description of the invention.

A circuit for changing the frequency of a pulse train in response to a change in the average value of an applied digital signal applies the signal to be changed to a pulse subtractor. Application of a predetermined number of digital data signals of one sign causes the periodic subtraction of the pulse at the subtractor, thus reducing the average frequency at the output from the pulse subtractor. The signal at the output from the subtractor is applied to a pulse adder which adds a pulse to the subtracted pulse trained in response to a predetermined number of data pulses of the opposite sign. The output pulse train is thus varied in frequency in response to variation in the average value of the digital data input. The order of addition and subtraction may be reversed, and one of the functions can be performed in the feedback loop of a frequency synthesizer.

BRIEF DESCRIPTION OF THE DRAWINGS

FIG. 1 is a block diagram of a circuit for the practice of the invention.

FIG. 2 is a detailed circuit diagram of the circuit of FIG. 1.

DETAILED DESCRIPTION OF THE INVENTION

FIG. 1 is a block diagram of a circuit for the practice of the invention. In FIG. 1, a fixed reference AC voltage is applied at terminal 10 to a pulse subtractor 12. The frequency at terminal 10 is supplied by a precision frequency source such as a crystal oscillator. The output of subtractor 12 is connected to a pulse adder 14 which produces an output at terminal 16 at a frequency which is adjusted with respect to the input frequency at terminal 10. The adjustment is a function of digital data in binary form that is applied at terminal 18. The data from terminal 18 is applied as one input to AND gate 20 and also as an input to inverter 22. The output of inverter 22 is taken as one input to AND gate 24. A second input to AND gates 20 and 24 is supplied by oscillator 26. The output of AND gate 20 is divided by a constant K in divider 28, and the divided result is taken to control subtractor 12 to subtractor pulses from the input at terminal 10. The output of AND gate 24 is taken to divider 30 where it is divided by a constant, here taken as the same K, and applied to control pulse adder 14 to add pulses to the input signal at terminal 10. The purpose of the circuit of FIG. 1 is to subtract a predetermined number of pulses from the referenced signal at terminal 10 for each predeterminednumber of bits of one sign applied at terminal 18 and to add a number of pulses, here the same number, to the signal applied at reference 10 for each predetermined number of bits of the opposite sign applied at terminal 18.

The operation of the circuit of FIG. 1 can be understood by considering first the range of frequencies involved. The data applied at terminal 18 are typically binary signals at a base frequency of the order of hundreds of Hz. The signal applied at reference 10 is the fixed reference frequency for a synthesizer which is typically at a frequency of the order of MHz or tens of MHz. The frequency of oscillator 26 is selected in conjunction with the divider constant K of dividers 28 and 30 to add or subtract a predetermined number of pulses from the signal applied at terminal 10 for each binary digit or predetermined number of binary digits applied at terminal 18. Details of the selection will become apparent in a consideration of the actual circuits involved. However, it should be evident from an inspection of FIG. 1 that if it is desired to make one correction for each data bit applied at terminal 18, then the frequency of oscillator 26 should be chosen equal to the product of the data frequency at terminal 18 and the dividing constant K of dividers 28 and 30. It it is desired to make two corrections per data cycle, then the frequency of oscillator 26 should be twice the product of the frequency of data applied at terminal 18 and the constant K of dividers 28 and 30. In the representation of FIG. 1, the division constants of dividers 28 and 30 are in a rate of 2:1. This will be seen to cause the same number of pulses to be subtracted from the reference frequency for a data bit of one sign as are added for a data bit of the other sign. In the application for which the circuit of the present invention was developed, it was desired to shift the output of the circuit for an amount that was proportional to the shift in the average value of the data input. It is equally possible to vary the shift in the two directions by making the two dividing constants unequal. This is a matter of design choice.

FIG. 2 is a circuit diagram of a circuit for the practice of the present invention. In FIG. 2, elements that correspond to those of FIG. 1 are given corresponding numbers. Thus, in FIG. 2, terminal 10 receives a properly buffered signal at 14.4 MHz from a source such as a crystal-controlled oscillator. That signal is squared as necessary to form a pulse train and is applied to subtractor 12, which includes a blocking capacitor 36 that is coupled to a programmable divider 38. The programmable divider 38 is capable of dividing by either three or four under external control. When programmable divider 38 divides by three, it produces a signal at 4.8 MHz that will be seen to be the nominal output frequency at terminal 16. It is intended to take this signal as the reference frequency source for a synthesizer in an FM transceiver. If the frequency to be generated by the synthesizer is modulated with voice or data having no DC components, there would be no reason to cause any change in the frequency of the 4.8-MHz reference signal. However, if the presence of data with a non-zero average value makes it desirable to reduce the frequency applied to the synthesizer, then programmable divider 38 is caused from time to time to divide by four instead of three. This produces an output from programmable divider 38 that is a pulse train at a mixture of frequencies of 4.8 MHz and 3.6 MHz. The average value of this mixture will be some number less than 4.8 MHz, the amount depending upon the percentage of the time the programmable divider has been caused to divide by four instead of three. The output of programmable divider 38 is taken to buffer 40 from which it is applied to adder 14. It is evident that the result of causing programmable divider 38 to divide occasionally by four instead of three has had the effect of subtracting amounts from the frequency of the input signal at terminal 10, achieving the purpose of subtractor 12.

Control of subtractor 12 and of adder 14, to which it is connected, is accomplished in FIG. 2 by taking the signal at 14.4 MHz from terminal 10 to serve when modified as oscillator 26. Thus, the signal from terminal 10 is divided by two in divider 42 which is coupled to terminal 10, and the output of divider 42 is divided again by 32 in divider 44. This produces an output at 225 KHz which is the output of oscillator 26 of FIG. 1. This output is taken as an input to AND gates 20 and 24 of FIG. 2. Data bits applied at terminal 18 are taken through a resistor 21 as a second input to AND gate 20 and through inverter 22 as the second input to AND gate 24. Inverter 22 as shown here was actually a NAND gate with both inputs taken from terminal 18. With a bit rate of the order of 150 hertz applied at the terminal 18, it can be seen that a bit of one sign will enable AND gate 20, passing pulses at a frequency of 225 KHz to divider 28. This is set to divide by 8192. The result is to produce pulses at 27.47 Hz which are taken to subtractor 12. There they are applied both directly and through a low-pass filter 46 to an EXCLUSIVE-OR (EO) gate 48. The output of EO gate 48 is taken through resistor 50, filtered in low-pass filter 52, and taken through blocking capacitor 54. There it is applied both directly and through a resistive network 56 to programmable divider 38. An RF choke 57 completes the connection of external elements at programmable divider 38. The result is that whenever AND gate 20 is enabled, divider 28 begins to accumulate a count. Suppose first that it is a binary "1" that enables AND gate 20 and that a steady stream of 1's is applied at terminal 18. Divider 28 will produce pulses at 27.47 Hz which are shaped into narrow pulses of the same frequency by the combination of low-pass filter 46 and EO gate 48. Programmable divider 38 will thus be caused to change its dividing ratio at a rate of 27.47 Hz. This represents the maximum rate at which the circuit of FIG. 2 will cause programmable divider 38 to shift to divide by four and hence will cause the maximum possible amount of subtraction and the lowest average values of the output frequency. Suppose now that a single bit from the same bit stream is applied at terminal 18. This will gate 1500 pulses of the output of divider 44 into divider 28. Since the 1500 pulses are fewer in number than the 8192 divide ratio of divider 28, that count will be accumulated. Divider 28 will produce no output until it has had a total of approximately six such pulses (actually, 8192/1500=5.46). This accumulation of counts in divider 28 reduces the amount of switching of programmable divider 38.

If it becomes desirable to increase the frequency at terminal 16 above that of the output of subtractor 12, then adder 14 is caused to operate. Adder 14 comprises a D flip-flop 58 which is clocked by the signal at 14.4 MHz that was applied at terminal 10. The output of subtractor 12, which is an AC signal at an average frequency that is less than or equal to 4.8 MHz, is taken as the input to flip-flop 58 and also as one input to EO gate 60. The output of D flip-flop 58 is used to clock D flip-flop 62 which receives as an input the output signal from divider 30. Divider 30 divides by 16,384 to produce a signal that would be at 13.73 Hz if AND gate 24 were held on by a continuous signal to inverter 22. To follow the operation of adder 14, suppose that a signal containing all zeroes is supplied at terminal 18. This will cause inverter 22 to apply a signal at AND gate 24 while AND gate 20 is cut off. AND gate 24 will thus apply pulses at 225 KHz to divider 30, which produces output pulses at 13.73 Hz. This input to D flip-flop 62 will produce extra pulses at the output of D flip-flop 62 that cause EO gate 60 to produce extra pulses in the output from adder 12. The effect is to add pulses so that the output of EO gate 60 is at a higher frequency than the output of subtractor 12. For this reason, it is appropriate to refer to adder 14 as an adder.

The circuit of FIG. 2 has as its objective the generation of an AC signal at terminal 16 that is caused to vary in frequency about the center value of 4.8 MHz as a function of the average value of the data. The values chosen for the elements of FIG. 2 were selected to provide a particular desired amount of frequency variation and response time. If it is desired to make the frequency change faster at terminal 16 in response to changes in the average value of data applied at terminal 18, this could be accomplished by reducing the divide ratios of any or all of dividers 42, 44, 28 and 30. For example, replacing divider 42 with a short circuit, removing a division by 2, would cause frequency changes to be made twice as often. The corner frequency of filter 46 determines the pulse width that EO 48 will generate. The width of this pulse is chosen to meet the input requirements of programmable divider 38. The circuit of FIG. 2 shows that, for equal excursions in the average value of the output, frequency dividers 30 and 28 were in a ratio of two to one. If it is desired to correct the frequency differently for bits of different sign, then the ratios of these two dividers with respect to one another could be changed correspondingly. It should also be evident that if the circuit of FIG. 2 is used in an FM transmitter that is used for both data and voice, it would be desirable to keep programmable divider 38 set continually on divide by three and thus disable dividers 28 and 30 during voice transmission. Under this circumstance, adder 12 would not add, subtractor 14 would not subtract and the circuit would comprise blocking capacitor 36, programmable divider 38, set to divide by 3, buffer 40 and EO gate 60.

The circuit of FIG. 2 is most useful when it is applied as a source of a reference frequency for a synthesizer in a radio transmitter or receiver. Such a circuit is shown in FIG. 2 in a configuration that also includes an alternate embodiment of the present invention. The output of terminal 16 in FIG. 2 is taken to a reference divider 64 which divides the reference frequency at terminal 16 by an integer that is chosen to relate the output frequency of the reference divider 64 to the channel separation that is desired in the output frequency of the synthesizer. Typical band spacings for channels in various land-mobile bands are 20, 25, and 30 Khz. An appropriately chosen one of these values would be selected for the output of reference divider 64 if the output of the synthesizer of FIG. 2 were used directly to set the frequency of transmission or of a local oscillator for a receiver. If the output of the synthesizer is to be multiplied by a constant to achieve the desired final frequency, then the desired band spacing must be divided by that same constant to achieve the desired output of reference divider 64. A later example will make this clear.

The output of reference divider 64 is taken to a phase detector 66 which produces an output that is taken to low-pass filter 68. The filtered output from low-pass filter 68 is taken to summer 70 where it is combined either with a data modulating signal from terminal 18 or with a voice modulating signal from terminal 72. The output of summer 70 controls voltage-controlled-oscillator (VCO) 74 which generates the desired output frequency at terminal 76. The output of VCO 74 is also taken through pulse adder 78 to divider 80 where it generates a feedback signal that is taken to phase detector 66 to close the loop of the synthesizer.

Pulse adder 78 is part of an alternate embodiment of the present invention in that it is possible to replace the substraction function that is accomplished by programmable divider 38 by the addition of pulses in adder 78. In this case programmable divider 38 can be replaced with a fixed divider or can be left as is and caused to divide only by 3. Pulse adder 14 of FIG. 2 continues to add pulses in response to data bits of one sign and a pulse adder like that of adder 14 is used as pulse adder 78. It should be evident that adding pulses in the feedback loop of the synthesizer of FIG. 2 is equivalent to subtracting pulses in subtractor 12 of FIG. 2. This follows because the effect of phase detector 66 in the loop is to cause changes in the output frequency of VCO 74 that tend to reduce the difference in phase between the output signals of reference divider 64 and divider 80. It follows that to add in the loop that contains divider 80 is equivalent to subtracting in the circuit that supplies reference divider 64.

The circuit of FIG. 2 without pulse adder 78 has been built and used in a synthesized radio transmitter operating at a frequency of the order of 900 MHz. This was accomplished by multiplying the output signal from VCO 74 by 6. The reference frequency supplied at terminal 10 was 14.4 MHz and the frequency of the data applied at terminal 18 was approximately 150 Hz. The digital signal applied at terminal 18 was at a level of zero volts for a binary "0" and five volts for a binary "1". This will be referred to as the signal of the first polarity. Its inverse, zero volts for a binary "1" and five volts, for a binary "1" is the signal of the second polarity. These are matters of design choice. Appropriate frequencies in the circuit are summarized in the Table which lists the elements of FIG. 2 and the frequency of the output from each. Referring to the Table, it can be seen that the output of programmable divider 38 is 4.8 MHz for a divisor of 3 and 3.6 MHz for a divisor of 4. In the absence of a data input at terminal 18, programmable divider 38 will be set to divide by 3 and thus produce an output of 4.8 MHz. When a data bit at terminal 18 causes programmable divider 38 to change to a different divisor, the result is to produce a few bits at 3.6 MHz, reducing the average value of the output to some figure less than 4.8 MHz. By this means, programmable divider 38 can be said to subtract from the nominal frequency of 4.8 MHz.

In the circuit for which values are represented in the Table, binary digits at a frequency of 150 Hz were applied to terminal 18. The output of divider 44 was applied as one input to and gates 20 and 24.

TABLE

| Frequencies of outputs of elements of FIG. 2 | |
|---|---|
| OUTPUT OF | FREQUENCY |
| Terminal 10 | 14.4MHz |
| Programmable divider 38: | |
| ÷3 | 4.8MHz |
| ÷4 | 3.6MHz |
| Divider 42 | 7.2MHz |
| Divider 44 | 225KHz |
| Terminal 18 | 150Hz |
| AND gate 20 | 225KHz |
| (per data bit: 1500 pulses) | |
| AND gate 24 | 225KHz |
| (per data bit: 1500 pulses) | |
| Divider 28 | 27.47Hz Max. |
| (one pulse per 5.46 data bits) | |
| Divider 30 | 13.73Hz Max. |
| (one pulse per 10.92 data bits) | |
| Terminal 16 | 4.8MHz ± $\Delta f$ |
| Reference divider 64 | 2083.3Hz ± $\Delta f'$ |
| Low-pass filter 68 | near DC |
| Summer 70 | Audio or data |
| VCO 74 | 150MHz nominal |
| Divider 80 | 2083.3Hz ± $\Delta f'$ |

As a result, when either and gate 20 or 24 was gated on by a data bit of an appropriate sign, its output was 1500 pulses per data bit of that sign. Thus, the output of divider 28 produces one corrective pulse per 5.46 data bits of the same sign and divider 30 produces one pulse per 10.92 data bits of the other sign. Terminal 16 produces a signal at a nominal 4.8 MHz, varied about that value by an amount designated $\Delta f$ in response to the presence of data of one sign or the other. Reference divider 64 was here selected to produce a frequency that would control a synthesizer producing a frequency to be multiplied by 6 with band spacing of 25 Kilohertz. For this reason, the frequency output of reference divider 64 is 2083⅓ Hz, one sixth of 25 KHz, plus or minus a divided frequency variation $\Delta f'$ that is introduced to correct for shifts of the average value of the data. Divider 80 is caused by the feedback action of the synthesizer to produce an output at the same frequency. The integral dividend of divider 80 is changed by one in response to a signal of terminal 79 to change channels in the transmitter that is controlled by the synthesizer of FIG. 2.

In the circuit that was built to practice the present invention, it was convenient to use the programmable divider 38 of FIG. 2 as the pulse subtractor of FIG. 12 and the combination of flip-flops 58 and 62 and EO gate 60 of FIG. 2 as the pulse adder 14 of FIG. 1. This is a matter of circuit convenience since a ¾ programmable divider is operable at relatively high frequencies and produces as an output a pulse train at a frequency that is lower than the input. It would be equally as effective, however, to reverse the order of pulse subtractor 12 and pulse adder 14 of FIG. 1 so that the input signal at terminal 10 was increased first in frequency and then decreased. This could be done quite readily by interchanging the elements of pulse subtractor 12 of FIG. 2 and those of pulse adder 14 of FIG. 2 so that terminal 10 was connected directly as an input to the D terminal of D flip-slop 58 and the output of EO gate 60 was taken as an input to programmable divider 38. Similiary, the pulse subtraction and pulse addition could have been carried out by cascading two programmable dividers. The first could be connected like programmable divider 38 of FIG. 2 so that the normal mode was a divide by 3 and the frequency adjustment was accomplished by dividing by 4. This results in a subtractor. If this were cascaded with a programmable divider that was set normally to divide by 4 but could be triggered as in FIG. 2 to divide by 3, then the programmable divder would comprise an adder. Such a cascade of dividers placed between terminals 10 and 16 of FIGS. 1 or 2 would produce an output pulse train at a frequency 1/12 of the input frequency, adjustable up or down in response to shifts in the average value of the data input. The best mode for the practice of the invention is that of FIG. 2. The alternate modes described above are available for the choice of the designer.

I claim:

1. In a frequency synthesizer adapted to be modulated by a digital signal having a non-zero average value, the improvement in a frequency source for said synthesizer comprising:
    a source of pulses at a fixed frequency; and
    means connected to the source of pulses for providing a variable reference frequency for said synthesizer, said providing means including means for varying the pulse rate of said source of pulses in proportion to the average value of said digital signal such that opposite polarity bits of said digital signal equally modulate the frequency synthesizer.

2. The frequency synthesizer according to claim 1 wherein said varying means varies the pulse rate of said source of pulse in proportion to the average D.C. value of a predetermined number of bits of said digital signal.

3. The frequency synthesizer according to claim 1 wherein said varying means varies the pulse rate such that a first polarity bit of the digital signal and a second polarity bit of the digital signal having a polarity opposite the first bit each cause the frequency of the synthesizer to change an equal amount.

4. A circuit for producing a train of pulses at an average frequency that is varied in response to an input of digital data, the circuit comprising:
    an input terminal receiving a train of input pulses at a frequency to be varied;
    a programmable divider connected to the input terminal and receiving the pulse train, the programmable divider being controlled to divide the input pulse train by a number x or a different number Y;
    a first divider means connected to the input terminal to produce an output that is a pulse train at a lower frequency than the frequency of the input pulse train;
    a data terminal receiving binary data signals
    a first date connected to the data terminal and to the output of the first divider means to produce as an output pulses at said lower frequency;
    a second divider means connected to the first gate to produce an output pulse for a predetermined number of pulses from the first gate;
    means connected to the second divider means for selectively causing the programmable divider to change from dividing by one of X and Y to the other for each output from the second divider means;
    an inverter connected to the data terminal to generate an inverted data pulse;
    a second gate connected to the inverter and to the first divider means to generate a train of pulses at the output of said second gate;
    a third divider means connected to the output of said second gate and having an output at which is generated a train of pulses;
    a first flip-flop connected to the programmable divider and receiving as an input the output of the programmable divider, the first flip-flop being clocked by the signal at the input terminal;
    a second flip-flop that is clocked by an output of the first flip-flop, the second flip-flop receiving as an input the output of the third divider means; and
    a third gate connected to the programmable divider and to the second flip-flop and producing as an output a train of pulses that is varied in frequency from the frequency of the input pulses according to the average value of the digital data.

5. A circuit for generating a variable frequency signal which varies in response to the average value of digital data, said circuit comprising:
    a source of pulses at a fixed frequency;
    means for selectively altering the frequency of said pulses in proportion to the average value of a plurality of bits of said digital data;
    said altering means comprisng means for adding additional pulses to said fixed frequency pulses such that the fixed frequency of said source is varied in a first predetermined direction in proportion to the average value of a number of bits of said digital data;
    said alternating means comprising means for subtracting pulses from said fixed frequency pulses so that the fixed frequency of said source is varied in a second predetermined direction opposite said first predetermined direction in proportion to the average value of a number of bits of said digital data;
    said adding means comprising a first dividing means responsive to a predetermined number of first polarity pulses from said source, said first dividing means controlling the rate at which additional pulses are added to said fixed frequency pulses, and said substracting means comprising a second dividing means responsive to a predetermined number of second polarity pulses from said source, said second dividing means controlling the rate at which said fixed frequency pulses are subtracted.

6. The circuit according to claim 5 wherein said altering means alters the frequency of the pulses in proportion to the average D.C. value of a predetermined number of binary bits of said digital data.

7. A method for generating a variable frequency signal which varies in response to the average value of digital data, comprising the steps of:

generating a source of pulses at a fixed frequency;
selectively altering the frequency of said pulses in proportion to the average value of a plurality of bits of said digital data including:
adding additional pulses to said fixed frequency pulses such that the fixed frequency of said source is varied in a first predetermined direction in proportion to the average value of a number of bits of said digital data;
subtracting pulses from said fixed frequency pulses so that the fixed frequency of said source is varied in a second predetermined direction opposite said first predetermined direction in proportion to the average value of a number bits of said digital data;
counting a predetermined number of first polarity pulses from the source, controlling the rate at which additional pulses are added to said fixed frequency pulses in response to the predetermined number of the first polarity pulses, counting a predetermined number of second polarity pulses from the source, and controlling the rate at which said fixed frequency pulses are subtracted in response to the predetermined number of second polarity pulses.

8. In a frequency synthesizer having a locked loop wherein the rate of loop pulses effects the output frequency of the synthesizer, a source of pulses at a fixed frequency and the synthesizer being adapted to be modulated by a digital signal having a non-zero average value, the improvement comprising:

first means connected to the source of pulses for varying the pulse rate of said source of pulses in response to the average value of said digital signal; and
second means connected to the locked loop for varying the pulse rate of said loop pulses in response to the average value of said digital signal, said first and second means cooperating to vary the respective pulse rates such that opposite polarity bits of said digital signal cause equal changes in the output frequency of the synthesizer.

9. The frequency synthesizer according to claim 8 wherein said first and second means each vary the respective pulse rates in proportion to the average D.C. value of a predetermined number of bits of said digital signal.

10. The frequency synthesizer according to claim 8 wherein said first means adds pulses to the pulses generated by said source when more bits of digital data have a first polarity than a second opposite polarity, and said second means adds pulses to said loop pulses when more bits of digital data have the second polarity.

* * * * *